(12) United States Patent
Schilling et al.

(10) Patent No.: US 10,843,380 B2
(45) Date of Patent: Nov. 24, 2020

(54) METHOD FOR THE MATERIAL-SAVING PRODUCTION OF WAFERS AND PROCESSING OF WAFERS

(71) Applicant: SILTECTRA GmbH, Dresden (DE)

(72) Inventors: Franz Schilling, Radeberg (DE); Wolfram Drescher, Dresden (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 307 days.

(21) Appl. No.: 15/565,499

(22) PCT Filed: Apr. 7, 2016

(86) PCT No.: PCT/EP2016/057632
§ 371 (c)(1),
(2) Date: May 15, 2018

(87) PCT Pub. No.: WO2016/162428
PCT Pub. Date: Oct. 13, 2016

(65) Prior Publication Data
US 2018/0243944 A1   Aug. 30, 2018

(30) Foreign Application Priority Data

Apr. 9, 2015   (DE) .................. 10 2015 004 601

(51) Int. Cl.
*B28D 5/00* (2006.01)
*B28D 1/00* (2006.01)
(Continued)

(52) U.S. Cl.
CPC ............ *B28D 5/0011* (2013.01); *B23K 26/53* (2015.10); *B28D 1/221* (2013.01); *B81C 1/0038* (2013.01);
(Continued)

(58) Field of Classification Search
None
See application file for complete search history.

(56) References Cited

U.S. PATENT DOCUMENTS

| 7,763,541 B2 | 7/2010 | Okuda |
| 2005/0048738 A1 | 3/2005 | Shaheen |

(Continued)

FOREIGN PATENT DOCUMENTS

| CN | 1521814 A | 8/2004 |
| CN | 1632911 A | 6/2005 |

(Continued)

OTHER PUBLICATIONS

International Preliminary Report on Patentability of corresponding PCT application—PCT/EP2016/057632.
(Continued)

*Primary Examiner* — Linda L Gray

(74) *Attorney, Agent, or Firm* — Murphy, Bilak & Homiller, PLLC

(57) ABSTRACT

The invention relates to a method for producing a multi-layer assembly. The method according to the invention comprises at least the following steps: providing a donor substrate (2) for removing a solid layer (4), in particular a wafer; producing modifications (12), in particular by means of laser beams (10), in the donor substrate (2) in order to specify a crack course; providing a carrier substrate (6) for holding the solid layer (4); bonding the carrier substrate (6) to the donor substrate (2) by means of a bonding layer (8), wherein the carrier substrate (6) is provided for increasing (Continued)

the mechanical strength of the solid layer (4) for the further processing, which solid layer is to be removed; arranging or producing a stress-producing layer (16) on the carrier substrate (6); thermally loading the stress-producing layer (16) in order to produce stresses in the donor substrate (2), wherein a crack is triggered by the stress production, which crack propagates along the specified crack course in order to remove the solid layer (4) from the donor substrate (2) such that the solid layer (4) is removed together with the bonded carrier substrate (6).

9 Claims, 2 Drawing Sheets

(51) Int. Cl.
| | | |
|---|---|---|
| *H01L 21/00* | (2006.01) | |
| *B81C 1/00* | (2006.01) | |
| *B23K 26/53* | (2014.01) | |
| *B28D 1/22* | (2006.01) | |
| *H01L 21/762* | (2006.01) | |
| *H01L 31/18* | (2006.01) | |
| *B23K 101/36* | (2006.01) | |

(52) U.S. Cl.
CPC .... *B81C 1/00357* (2013.01); *H01L 21/76251* (2013.01); *H01L 31/1804* (2013.01); *H01L 31/1896* (2013.01); *B23K 2101/36* (2018.08); *B81C 2201/0192* (2013.01); *Y10T 156/1059* (2015.01)

(56) References Cited

U.S. PATENT DOCUMENTS

| | | |
|---|---|---|
| 2008/0012140 A1 | 1/2008 | Nec |
| 2010/0230803 A1 | 9/2010 | Chien |
| 2012/0003815 A1 | 1/2012 | Lee |
| 2014/0038392 A1 | 11/2014 | Yonehara |

FOREIGN PATENT DOCUMENTS

| | | |
|---|---|---|
| CN | 1919113 A | 2/2007 |
| CN | 1973375 A | 5/2007 |
| CN | 101409221 A | 4/2009 |
| CN | 103380482 A | 10/2013 |
| CN | 103459082 A | 12/2013 |
| DE | 10 2013 007673 | 11/2014 |
| DE | 102013007673 | 11/2014 |
| DE | 102013016682 | 4/2015 |
| DE | 102014013107 | 4/2015 |
| DE | 102015000451 | 7/2016 |
| JP | 2007214478 A | 8/2007 |
| TW | 201446454 | 12/2014 |
| WO | 2009055048 | 4/2009 |
| WO | 2009061353 | 5/2009 |
| WO | 2010072675 | 7/2010 |
| WO | 2014/064606 | 5/2014 |
| WO | 2014064606 | 5/2014 |
| WO | 2015052220 | 4/2015 |

OTHER PUBLICATIONS

CN office action in related application, dated 2015.
DE translation of CN search in connection with first office action of corresponding application, dated 2015.

METHOD FOR THE MATERIAL-SAVING PRODUCTION OF WAFERS AND PROCESSING OF WAFERS

TECHNICAL FIELD

The invention at hand relates to a method for producing a multi-layer assembly, to a method for treating a solid layer and to a use of a carrier substrate.

BACKGROUND

Materials, such as, e.g., silicon, germanium or sapphire, are frequently used in the form of thin disks and plates (so-called wafers) in many technical areas (e.g. microelectronic or photovoltaic technology). As standard, such wafers are currently produced by sawing from an ingot, wherein relatively large material losses ("kerf-loss") are produced. Due to the fact that the used starting material is often very expensive, there are large efforts to produce such wafers with less material expenditure and thus more efficiently and more cost-effectively.

With the currently common methods, for example almost 50% of the used material are lost as "kerf-loss" solely in response to the production of silicon wafers for solar cells. Worldwide, this corresponds to an annual loss of more than 2 billion Euros. Due to the fact that the costs of the wafer account for the largest portion of the costs of the finished solar cell (more than 40%), the costs of solar cells can be reduced significantly by corresponding improvements of the wafer production.

Methods, which forego the common sawing and which can directly remove thin wafers from a thicker workpiece, e.g. by the use of temperature-induced stresses, appear to be particularly attractive for such a wafer production without karf-loss ("kerf-free wafering"). This includes in particular methods, as they are described in PCT/US2008/012140 and PCT/EP2009/067539, e.g., where a polymer layer, which is applied to the workpiece, is used to create these stresses.

Material losses are further produced in known factories for wafer processing, because the provided wafers must in each case be present with a standard thickness for handling in the standardized processes of such a factory. The target thickness is then reached on location by machining the wafers. The machining, however, has significant disadvantages. On the one hand, it destroys the material to be removed and, on the other hand, the remaining wafer portion is subjected to significant mechanical stresses. Machining methods further have the effect that heat and dust is produced. On principle, machining methods furthermore effect a scoring, by means of which the surface quality of the wafer is impacted.

SUMMARY

It is thus the object of the invention at hand to provide an alternative method, which, compared to the known methods, makes it possible to save resources and/or to improve quality.

According to the invention, the above-mentioned object is solved by means of a method for producing a multi-layer assembly. The method according to the invention preferably comprises at least the steps of providing a donor substrate for removing a solid layer, providing a carrier substrate for holding the solid layer, producing modifications, in particular by means of laser beams, in the donor substrate in order to specify a crack course, bonding the carrier substrate to the donor substrate by means of a bonding layer, wherein the carrier substrate is provided for increasing the mechanical strength of the solid layer, which is to be removed, for the further processing, arranging or producing a stress-producing layer on the carrier substrate, and thermally loading the stress-producing layer in order to produce stresses in the donor substrate, wherein a crack is triggered by the stress production, which crack propagates along the specified crack course in order to remove the solid layer from the donor substrate such that the solid layer is removed together with the bonded carrier substrate.

This solution is advantageous, because the desired solid layer is stable and is thus arranged on a carrier substrate so as to be capable of being transported and machined.

Further preferred embodiments are the subject matter of the following description parts and/or of the subclaims.

According to a further preferred embodiment of the invention at hand, the bonding layer connects the solid layer and the carrier substrate to one another by means of a substance-to-substance bond and the bonding layer is destructible by means of radiation, in particular laser radiation or UV radiation, or a free-flowing substance, in particular a liquid solution. This embodiment is advantageous, because a stable substance-to-substance bond is created on the one hand, which, if necessary, can be weakened, in particular destroyed, in particular for releasing the solid layer from the carrier substrate, e.g. chemically or by means of radiation. The bonding layer is in particular configured such that it is not destroyed by the stresses, which are produced by means of the stress-producing layer.

According to a further preferred embodiment of the invention at hand, the stress-producing layer is removed from the carrier substrate after removing the solid layer from the solid. This embodiment is advantageous, because the weight and the thickness of the multi-layer assembly are reduced thereby. In particular the thickness reduction provides for an improved integration of the multi-layer assembly in downstream machining processes. The removed polymer is preferably treated or disposed of for further use. In addition or in the alternative, it is conceivable that a material layer is produced on the solid layer, in particular epitaxially. A structural weakening of the carrier substrate and/or of the solid layer preferably occurs prior to the production of the material layer. The removal or stripping or destruction of material of the respective layer, e.g., is to hereby be understood as structural weakening. In terms of the invention, a perforation of the respective layer can thus preferably be effected in sections along predetermined or defined areas, respectively, in particular lines, in particular by means of laser beams or machining or etching. In addition or in the alternative, the respective layer can be stripped off partially or completely along the predetermined or defined areas, respectively, in particular lines. That is, trench-like depressions can be produced. This embodiment is advantageous, because the structural weakening prevents the creation of large stresses, in analogy to expansion joints in response to a temperature control of the multi-layer assembly. This is further advantageous, because an unwanted bending or breaking of the multi-layer assembly is thus prevented. A temperature control of the multi-layer assembly can thereby be required, e.g. in response to the production or arrangement of a further material layer at the solid layer or at the carrier layer. Temperatures of more than 400° C. or of more than 600° C. or of more than 800° C. or of more than 1000° C. thus appear, e.g. in response to an epitaxial production of a material layer. The predetermined or defined areas, respectively, preferably specify lines, wherein a first plurality of lines is particularly preferably provided parallel to one another and a second plurality of lines is also provided parallel to one another. The first number, in particular the plurality of lines, is preferably oriented at an incline, in particular orthogonally to the second number, in particular plurality of lines. The predetermined or defined areas, respectively, thus preferably form a lattice-like pattern. Individual or a plurality of the first number of lines can thereby intersect individual or a plurality, of the second number of lines. Each number hereby preferably represents one or more than one line. The portions of the first plurality and the portions of the second plurality preferably define area portions, in particular rectangular or square area portions, of the respective layer, in particular of the solid layer. The length of such an area portion preferably corresponds or equals, respectively, to the length of one or a plurality of unit(s), in particular chip or chips, respectively, which are to be detached or worked out of this area portion, respectively. The width of such an area portion preferably corresponds or equals, respectively, to the width of one or a plurality of unit(s), in particular chip or chips, respectively, which are to be detached or worked out of this area portion, respectively.

According to a further preferred embodiment of the invention at hand, the provided carrier substrate is used repeatedly to produce a multi-layer assembly, wherein the solid layer is removed from the carrier substrate prior to the repeated provision, and the carrier substrate is treated, in particular polished, prior to the repeated provision. This embodiment is advantageous, because material losses are reduced to a large extent by means of the reuse of the carrier substrate.

According to a further preferred embodiment of the invention at hand, a sacrificial layer is arranged or produced on the carrier substrate prior to the arrangement or production of a stress-producing layer on the carrier substrate, wherein the stress-producing layer is arranged or produced on the sacrificial layer. This embodiment is advantageous, because an adhesion is preferably effected by means of the sacrificial layer and/or the release of the stress-producing layer from the carrier substrate is facilitated.

According to a further preferred embodiment of the invention at hand, the stress-producing layer has a polymer, in particular polydimethylsiloxane (PDMS), or consist thereof, wherein the thermal loading preferably takes place in such a way that the polymer experiences a glass transition, wherein the stress-producing layer is temperature-controlled, in particular by means of liquid nitrogen, to a temperature below the room temperature or below 0° C. or below −50° C. or below −100° C. or below −110° C., in particular to a temperature below the glass transition temperature of the stress-producing layer.

This embodiment is advantageous, because it has been recognized that the forces required for triggering a crack and for cracking line can be produced in a donor substrate by means of the thermal loading of the stress-producing layer, in particular by utilizing the property changes of the material of the stress-producing layer, which occurs in response to the glass transition.

According to a further preferred embodiment of the invention at hand, the modifications are local cracks in the crystal lattice and/or material portions, which are transferred into another phase, and/or the modifications are produced by means of laser beams, which are introduced via an outer surface of the donor substrate, in particular at which the carrier substrate is arranged, of at least one laser device. This embodiment is advantageous, because the cracking line or the crack course, respectively, can be specified in a highly accurate manner by means of the modifications.

To provide the laser beams, which are to be introduced into the donor substrate, the laser device is configured in such a way according to a further preferred embodiment of the invention at hand that the laser beams emitted by said device produce the modifications at predetermined locations within the donor substrate, wherein the laser device is preferably adjusted in such a way that the laser beams emitted by said device for producing the modifications penetrate into the donor substrate to a defined depth of less than 200 µm, preferably of less than 150 µm and more preferably of less than 100 µm and particularly preferably of less than 60 µm or of less than 50 µm, wherein the laser device has a pulse duration of below 10 ps, preferably of below 1 ps and particularly preferably of below 500 fs.

Moreover, it is conceivable that the modifications are produced only after the carrier substrate is attached to the donor substrate. In this case, the carrier substrate for the radiation is preferably embodied in a transparent or partially transparent manner.

According to a further preferred embodiment of the invention at hand, the laser device comprises a femtosecond laser (fs laser) and the energy of the laser beams of the fs laser is preferably chosen in such a way that the damage propagation of each modification in the wear layer and/or in the sacrificial layer is smaller than 3-times the Rayleigh length, preferably smaller than the Rayleigh length and particularly preferably smaller than one third times the Rayleigh length and/or the wavelength of the laser beam of the fs laser is chosen in such a way that the absorption of the wear layer and/or of the sacrificial layer is smaller than 10 $cm^{-1}$ and preferably smaller than 1 $cm^{-1}$ and particularly preferably smaller than 0.1 $cm^{-1}$ and/or that the individual modifications in each case result as a result of a multiphotonic excitation effected by the fs laser.

According to a further preferred embodiment of the invention at hand, the surface of the donor substrate exposed by the removal of the solid layer is handled, in particular treated, preferably smoothed, in particular polished, prior to a renewed introduction of laser beams to produce modifications in the donor substrate and/or prior to a renewed application of the carrier substrate or of another carrier substrate to the donor substrate. This embodiment is advantageous, because the solid body is divided in the area of the modifications in particular so as to permeate the modifications, by means of the cracking line, whereby the non-removed portions of the modifications represent or effect, respectively, a structuring of the exposed surface of the donor substrate. With the mentioned embodiment, the surface structure of the exposed surface of the donor substrate is treated, in particular smoothed, in particular smoothed by means of polishing.

The exposed surface of the donor substrate is furthermore cleaned after the smoothing, in particular polishing. The cleaning hereby preferably occurs by using a free-flowing substance, in particular a liquid or a gas. The cleaning preferably comprises the removal of loose particles from the exposed surface.

According to the invention, the mentioned object is also solved by a method for treating a solid layer. The method according to the invention for treating a solid layer thereby preferably comprises at least the steps of providing a multi-layer assembly, in particular produced according to an above-described method, having a carrier substrate comprising a solid layer attached thereto, wherein the solid layer has an exposed surface comprising a defined surface structure, wherein the defined surface structure results from a removal, which is effected by means of a crack, from a donor substrate, at least in sections, the further processing, in particular processing in a further device or process chain, in particular polishing or coating or structuring, in particular by means of machining or chemical, e.g. etching methods, for chip production, or dividing or epitaxy or cleaning, in particular by means of plasma, of the solid layer arranged on the carrier substrate, and the separation of the solid layer from the carrier substrate by a destruction of the bonding layer.

This solution is advantageous, because the solid layer can be machined on the carrier substrate and can be removed from the carrier substrate without a destruction of the carrier substrate. Significant material savings thus result, because the non-destroyed carrier substrate can be reused. A multi-layer assembly produced according to the method according to claims 1 to 9 can thus be used or treated, respectively, for the solid body treatment in a further factory or in a further process chain.

Further preferred embodiments are the subject matter of the description parts below and/or of the subclaims.

According to a preferred embodiment of the invention at hand, the bonding layer is loaded with radiation or with a free-flowing substance and disintegrates as a result of the loading, wherein the radiation is preferably laser radiation, in particular of an fs laser. This solution is advantageous, because it is possible through this to remove the solid layer from the carrier substrate without a mechanical stress or with an only very small mechanical stress.

The invention at hand is furthermore solved by a use of a carrier substrate for providing and/or machining a plurality of solid layers. The use of the carrier substrate according to the invention thereby preferably comprises that the solid layers are accommodated consecutively by the carrier substrate, wherein the carrier substrate is in each case connected to the respective solid layer by means of at least one bonding layer, wherein the solid layer is released from the carrier substrate by destruction of the bonding layer after the machining and/or for the provision thereof, wherein a treatment, in particular polishing, of the carrier substrate is effected after the release of the solid layer and prior to the attachment of a further solid layer. In addition to the portions, which are formed as a result of the crack in response to the removal from the donor substrate, the surface structure of the exposed surface of the solid layer also has further portions, which are structured by the modifications.

This solution is advantageous, because the respective solid layer is maintained so as to be stable in such a way that it can be machined, e.g., and such that significant material savings are effected, by means of the repeated use of one or a plurality of carrier substrate(s).

Further preferred embodiments are the subject matter of the following description parts and/or of the subclaims.

According to a further preferred embodiment of the invention at hand, the carrier substrate is preferably embodied in a disk-like manner, in particular comprising two surfaces, which are parallel and flat relative to one another, and/or has a thickness of less than 800 µm and, according to a further preferred embodiment of the invention at hand, the solid layer has a thickness of between 10 µm and 150 µm, in particular of between 20 µm and 60 µm. Particularly preferably, the total thickness of the carrier substrate with the solid layer bonded thereto is preferably less than 900 µm. This solution is advantageous, because a multi-layer assembly is provided, which can be fed into the processes of a wafer processing factory, without having to significantly change the processes of the wafer processing factory, and significantly less material is used as compared to the existing processes.

The donor substrate or the solid body, respectively, or the workpiece, respectively, preferably has a material or a material combination of one of the main groups 3, 4 and 5 of the periodic table of the elements, such as, e.g. Si, SiC, SiGe, Ge, GaAs, InP, GaN, $Al_2O_3$ (sapphire), AlN. Particularly preferably, the donor substrate has a combination of elements occurring in the third and fifth group of the periodic table. Conceivable materials or material combinations are thereby, e.g., gallium arsenide, silicon, silicon carbide, etc.. The donor substrate can furthermore have a ceramic (e.g. $Al_2O_3$—aluminum oxide) or can consist of a ceramic; preferred ceramics are thereby, e.g., perovskite ceramics (such as, e.g. Pb-, O-, Ti/Zr-containing ceramics) in general and lead-magnesium-niobates, barium titanate, lithium titanate, yttrium-aluminum-garnet, in particular yttrium-aluminum-garnet crystals for solid state laser applications, SAW ceramics (surface acoustic wave), such as, e.g. lithium niobate, gallium orthophosphate, quartz, calcium titanate, etc., in particular. The donor substrate thus preferably has a semiconductor material or a ceramic material or the donor substrate particularly preferably consists of at least one semiconductor material, respectively, or of a ceramic material. It is moreover conceivable that the donor substrate has a transparent material or partially consists or is made, respectively, of a transparent material, such as, e.g. sapphire. Further materials, which are possible hereby as solid material alone or in combination with another material are, e.g., "wide band gap" materials, InAlSb, high-temperature superconductors, in particular rare earth cuprate (e.g. YBa2Cu3O7). In addition or in the alternative, it is conceivable that the donor substrate is a photomask, wherein preferably each photomask material known on the filing date and particularly preferably combinations thereof can be used as photomask material in the case at hand. The donor substrate and the carrier substrate preferably consist of the same material. In the alternative, however, it is also conceivable that the donor substrate and the carrier substrate consist of different materials. The carrier substrate can consist of the materials mentioned with regard to the donor substrate or can have them.

According to a further preferred embodiment of the invention at hand, more than 5%, in particular more than 10% or more than 20% or more than 30% or more than 40% or more than 50% or more than 60% or more than 70% or more than 80% or more than 90% or more than 95% of the crystal lattice embodied during the course of the crack is changed, in particular damaged. This embodiment is advantageous, because the crystal lattice can be changed, e.g. by means of the laser loading, or because defects, in particular micro cracks, can be produced, respectively, in such a way that the forces required for removing the solid layer from the solid or from the donor substrate, respectively, can be adjusted. In terms of the invention at hand it is thus possible that the crystal structure in the area of the crack course is modified or damaged in such a way, respectively, by means of laser radiation that the solid layer is released or removed, respectively, from the donor substrate as a result of the laser treatment.

The subject matters of the patent applications bearing file numbers PCT/EP2014/071512, DE 102013016682.9, DE 102015000451.1 and DE102014013107.6, which disclose a modification production in a solid by means of laser beams, are made the subject matter of the invention at hand in their entirety by reference. The subject matters of publications PCT/US2008/012140 and PCT/EP2009/067539, which disclose the removal of solid layers by means of crack formation and crack propagation, are furthermore also made the subject matter of the invention in their entirety.

In all cases, in which this word is used in connection with the invention at hand, the use of the word "substantially" preferably defines a deviation in the range of 1%-30%, in particular of 1%-20%, in particular of 1%-10%, in particular of 1%-5%, in particular of 1%-2%, from the determination, which would be at hand without the use of this word.

BRIEF DESCRIPTION OF THE FIGURES

Further advantages, goals and characteristics of the invention at hand will be discussed by means of drawings enclosed to the description below, in which the solutions according to the invention are illustrated in an exemplary manner. Components or elements of the solutions according to the invention, which correspond at least substantially with regard to their function in the figures, can hereby be identified with the same reference numerals, wherein these components or elements do not need to be numbered or explained in all figures.

DETAILED DESCRIPTION

Figure 1:
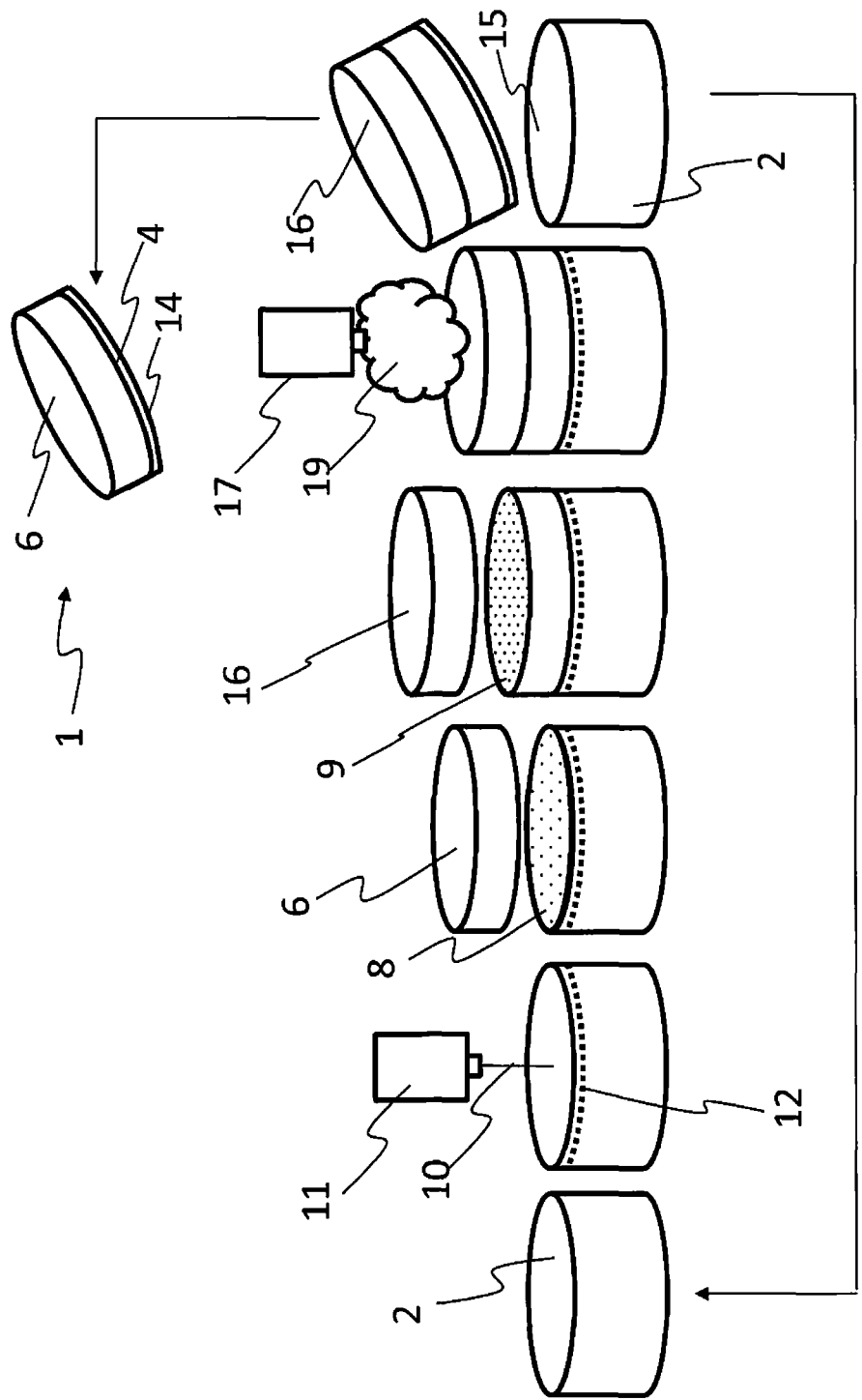
FIG. 1 shows, schematically, a method for producing a multi-layer assembly.

FIG. 1 shows, schematically, a plurality of states of a method for producing a multi-layer assembly 1. The first partial illustration shows a donor substrate 2, the surface of which, to which a carrier substrate 6, preferably of GaAs, is bonded in a further step, is preferably polished and cleaned. The donor substrate 2 can hereby preferably be an ingot or a thick wafer.

The second partial illustration shows a radiation source, in particular a laser device 11, which emits beams, in particular one or a plurality of laser beams 10, by means of which modifications 12 are produced in the interior of the donor substrate 2, i.e. preferably spaced apart from all outer surfaces of the donor substrate 2, in particular in one plane.

In the next partial illustration, reference numeral 8 identifies a bonding layer, which serves to fix the carrier substrate 6 to the donor substrate 2 by means of a substance-to-substance bond. It is conceivable hereby, e.g., for the bonding layer 8 to consist of an adhesive, in particular a light-absorbing adhesive, or to be produced by the local liquefication of the carrier substrate 6 and/or of the donor substrate 2, in particular as a result of a heat treatment. The bonding layer 8, however, preferably consists of a polymer material or, particularly preferably, has a polymer material, respectively.

The fourth partial illustration shows a stress-producing layer 16, which, in the shown example, was initially produced so as to then be arranged on the carrier substrate 6. The carrier substrate 6 is preferably coated with a sacrificial layer 9 prior to the application of the stress-producing layer 16 to the carrier substrate 6, or prior to the production of the stress-producing layer 16 on the carrier substrate 6. The sacrificial layer 9 can hereby be provided, e.g. as adhesion promoter or for more easily removing the stress-producing layer 16. The stress-producing layer 16 preferably has a thickness, which is many times greater than the thickness of the sacrificial layer 9.

According to the next partial illustration, provision is made for a temperature control device 17, which emits a coolant 19, in particular liquid nitrogen. The coolant 19 thereby effects a very quick cool-down of the stress-producing layer 16 to a temperature below the glass transition temperature of the material of the stress-producing layer 16. By cooling down the stress-producing layer 16, the stress-producing layer 16 contracts and thus introduces stresses into the donor substrate 2. When the stresses exceed a critical intensity, a crack forms in the area of the modifications 12 and thereby removes the solid layer 4 from the donor substrate 2, whereby a surface 15 of the donor substrate 2 is exposed on the one hand and whereby a surface 14 of the solid layer 4 is exposed on the other hand.

Preferably after the removal of the solid layer 4 from the donor substrate 2, the stress-producing layer 16 and preferably also the sacrificial layer 9 is removed from the carrier substrate 6 according to the upper arrow, resulting in the multi-layer assembly 1 according to the invention. According to the lower arrow, the donor substrate 2 is used as donor substrate 2 again or the described method starts again, respectively. For this purpose, the donor substrate 2 is preferably treated, the exposed surface 15 is preferably in particular handled, in particular smoothed, in particular polished.

The carrier substrate 6 serves to thin a donor substrate 2 and as stabilizer in response to the machining of the respective solid layer 4.

The invention at hand thus refers to a method for producing a multi-layer assembly 1. The method according to the invention thereby preferably comprises at least the steps: providing a donor substrate 2 for removing a solid layer 4, in particular a wafer; producing modifications 12, in particular by means of laser beams 10, in the donor substrate 2 in order to specify a crack course; providing a carrier substrate 6 for holding the solid layer 4; bonding the carrier substrate 6 to the donor substrate 2 by means of a bonding layer 8, wherein the carrier substrate 6 is provided for increasing the mechanical strength of the solid layer 4 for the further processing, which solid layer is to be removed, arranging or producing a stress-producing layer 16 on the carrier substrate 6, thermally loading the stress-producing layer 16 in order to produce stresses in the donor substrate 2, wherein a crack is triggered by the stress production, which crack propagates along the specified crack course in order to remove the solid layer 4 from the donor substrate 2 such that the solid layer 4 is removed together with the bonded carrier substrate 6.

Figure 2:
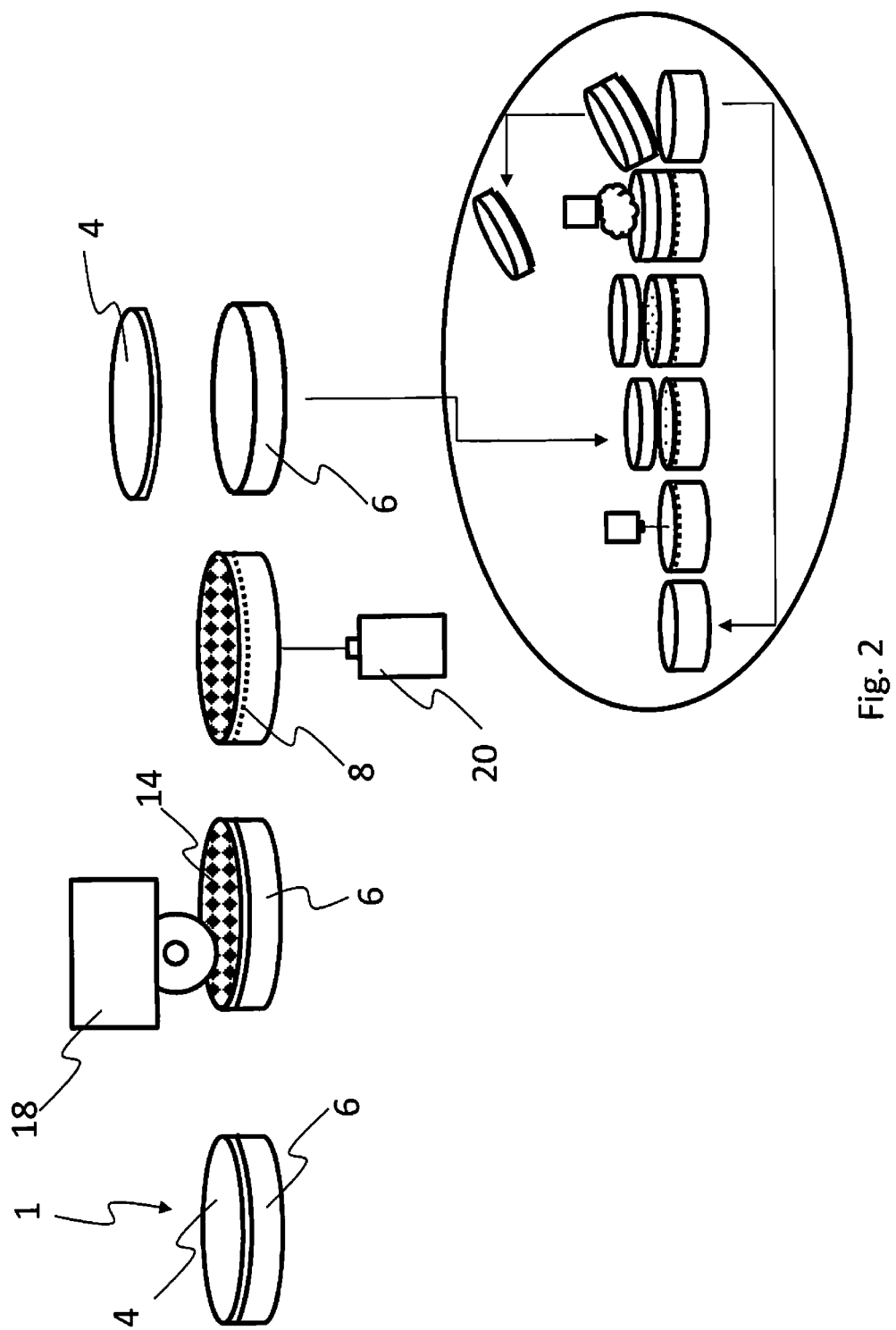
FIG. 2 shows, schematically, the treatment of a solid layer with the help of a carrier substrate.

A multi-layer assembly 1, as it was preferably produced according to the embodiments with regard to FIG. 1, is shown in FIG. 2

In the second partial illustration shown next to the first partial illustration, the multi-layer assembly 1 is arranged in such a way with respect to a machining device 18 that the exposed surface 14 of the solid layer 4 can be treated by means of the machining device 18. It is conceivable hereby that the machining device 18 treats the exposed surface 14 mechanically, in particular by machining, optically, chemically and/or by means of plasma.

A decomposition device 20, by means of which the bonding layer 8 is loaded, in particular destroyed, is illustrated in the third partial illustration. For this purpose, the decomposition device 20 emits radiation, e.g.. The radiation can hereby preferably be laser radiation or UV radiation. In the case of laser radiation, the radiation is preferably emitted by a picosecond or femtosecond laser. In the alternative, however, it is also conceivable for the decomposition device

20 to output a free-flowing substance, in particular a fluid, by means of which the bonding layer is dissolved. In the alternative or in addition, it is conceivable for the decomposition device 20 to produce a temperature, by means of which the bonding layer 8 is decomposed or dissolved.

A state after the removal of the solid layer 4 from the carrier substrate 6 is shown in the fourth partial illustration. The carrier substrate 6 is then preferably treated, in particular cleaned and/or smoothed, in particular polished.

The elliptical illustration shows the method illustrated by FIG. 1. The arrow hereby identifies that the exposed and preferably treated carrier substrate 6 is used again as a carrier substrate 6 in the method shown in FIG. 1.

The invention is advantageous, because it reduces the material losses and provides a solution for producing extremely, in particular absolutely flat thin solid layers 4, in particular wear wafers. The solid layers 4 produced in this way thus have an extremely flat rear side, whereby they are in particular suitable for a 3D integration, because they do not have a warp, e.g., and preferably also no other deformations.

| List of Reference Numerals | | | |
|---|---|---|---|
| 1 | multi-layer assembly | 4 | solid layer |
| 2 | donor substrate | 6 | carrier substrate |
| 8 | bonding layer | 15 | exposed surface of the donor substrate |
| 9 | sacrificial layer | 16 | stress-producing layer |
| 10 | laser beams | 17 | temperature control device |
| 11 | laser device | 18 | machining device |
| 12 | modifications | 19 | coolant |
| 14 | exposed surface of the solid layer | 20 | decomposition device |

The invention claimed is:

1. A method for producing a multi-layer assembly the method comprising:
   providing a donor substrate for removing a solid layer from the donor substrate;
   producing modifications in the donor substrate in order to specify a crack course;
   providing a carrier substrate for holding the solid layer;
   bonding the carrier substrate to the donor substrate by means of a bonding layer, wherein the carrier substrate is provided for increasing mechanical strength of the solid layer for further processing, which solid layer is to be removed;
   arranging or producing a stress-producing layer on the carrier substrate;
   thermally loading the stress-producing layer in order to produce stresses in the donor substrate, wherein a crack is triggered by the stress production, which crack propagates along the specified crack course in order to remove the solid layer from the donor substrate such that the solid layer is removed together with the bonded carrier substrate.

2. The method according to claim 1, wherein the bonding layer connects the solid layer and the carrier substrate to one another by means of a substance-to-substance bond and is destructible by means of radiation from a radiation source or a free-flowing substance.

3. The method according to claim 2, wherein the stress-producing layer is removed from the carrier substrate after removing the solid layer from the donor substrate and/or a material layer is produced on the solid layer, wherein a structural weakening of the carrier substrate and/or of the solid layer is effected prior to the production of the material layer.

4. The method according to claim 3, wherein the carrier substrate is used repeatedly to produce a multi-layer assembly, wherein the solid layer is removed from the carrier substrate prior to the repeated provision, and the carrier substrate is treated prior to the repeated provision.

5. The method according to claim 4, wherein a sacrificial layer is arranged or produced on the carrier substrate prior to the arrangement or production of the stress-producing layer on the carrier substrate, wherein the stress-producing layer is arranged or produced on the sacrificial layer.

6. The method according to claim 5, wherein the stress-producing layer comprises a polymer, wherein the stress-producing layer is temperature-controlled to a temperature below a glass transition temperature of the stress-producing layer.

7. The method according to claim 6, wherein the modifications are cracks in a crystal lattice and/or material portions of the donor substrate, and/or the modifications are produced by means of laser beams which are introduced via an outer surface of the donor substrate by a laser device.

8. The method according to claim 7, wherein the laser device is configured so that laser beams emitted by the laser device produce the modifications at predetermined locations within the donor substrate, wherein the laser device is adjusted so that the laser beams emitted by the laser device for producing the modifications penetrate into the donor substrate to a defined depth of less than 200 µm, wherein the laser device has a pulse duration of below 10 ps.

9. The method according to claim 8, wherein:
   the laser device comprises a femtosecond laser and the energy of the laser beams of the femtosecond laser is chosen so that damage propagation of each modification in the donor substrate is smaller than 3-times the Rayleigh length;
   the wavelength of the laser beams of the femtosecond laser is chosen so that absorption by the donor substrate is smaller than 10 $cm^{-1}$; and/or
   the modifications in each case are produced as a result of a multi-photonic excitation effected by the femtosecond laser.

* * * * *